United States Patent [19]
Hardesty et al.

[11] Patent Number: 5,963,068
[45] Date of Patent: Oct. 5, 1999

[54] FAST START-UP PROCESSOR CLOCK GENERATION METHOD AND SYSTEM

[75] Inventors: Jeffrey R. Hardesty; Geoffrey Hall; Kelvin McCollough, all of Austin, Tex.

[73] Assignee: Motorola Inc., Austin, Tex.

[21] Appl. No.: 08/901,645

[22] Filed: Jul. 28, 1997

[51] Int. Cl.[6] ................................................ H03K 1/04
[52] U.S. Cl. ......................... 327/156; 327/142; 327/147; 327/151; 327/160; 327/294; 327/299
[58] Field of Search .................................... 327/156, 142, 327/147, 148, 151, 160, 294, 299

[56] References Cited

U.S. PATENT DOCUMENTS

| | | | |
|---|---|---|---|
| 4,748,559 | 5/1988 | Smith et al. | 364/200 |
| 4,758,945 | 7/1988 | Remedi | 364/200 |
| 5,410,582 | 4/1995 | Sato | 327/294 |
| 5,694,308 | 12/1997 | Cave | 363/59 |

*Primary Examiner*—Margaret R. Wambach
*Attorney, Agent, or Firm*—Craig J. Yudell

[57] ABSTRACT

A PLL based clock generation circuit that enables processor execution during phase locking is provided. A PLL (310) generates a PLL clock output to a divider (330), which divides the PLL clock at a system clock output. PLL (310) outputs a frequency lock signal upon acquiring a desired output frequency that initiates a counter (320) and enables execution in a CPU (350) being clocked by the system clock. CPU (350) is thereby enabled to execute during phase locking at a divided frequency without risk of frequency overshoot induced failures. A phase lock signal, indicating PLL (310) has achieved phase lock, output by counter (320) is logically combined (340) with a signal output from CPU (350) requesting maximum frequency operation. The combined signal selects divider (330) to enable a maximum frequency system clock, thereby enabling CPU (350) to execute at maximum frequency when the PLL (310) is safely phase locked.

19 Claims, 2 Drawing Sheets

5,963,068

FAST START-UP PROCESSOR CLOCK GENERATION METHOD AND SYSTEM

FIELD OF THE INVENTION

The present invention relates in general to a phase-locked loop (PLL) based clock generation system, and in particular the present invention relates to a dual bandwidth PLL based clock generation system such as those used in battery powered devices.

BACKGROUND OF THE INVENTION

In low power electronic applications such as portable cellular phones or laptop computers, an important design goal is to minimize power consumption to increase the electronic device's battery lifetime. Such battery powered devices typically operate in a low power mode when the device is not operational or being utilized by the user to conserve battery power. In portable devices having a PLL based clock generation circuit, the PLL is commonly disabled during the low power mode. When switching from low power mode to an operational mode, the PLL is reenabled to provide a system clock for clocking the portable device.

When reacquiring phase-lock after being reenabled or at startup of the system, the PLL will overshoot the target frequency when initially attempting to acquire the programmed system frequency. If the PLL's targeted output frequency is at the maximum specified frequency of the system's processor, the PLL overshoot will cause memory access failures or execution failures in the processor. To prevent these problems in prior art systems, execution control circuitry is included that delays execution within the system's processor until after the PLL acquires phase-lock.

As will be appreciated, a portable device is consuming battery power at an operational level during this delay without the processor being operational. Therefore, it would be desirable to provide a PLL clock generation system that does not introduce the delay in processor execution without risk of overshoot related failures, thus decreasing the time spent in a full power mode.

DESCRIPTION OF A PREFERRED EMBODIMENT

The present invention provides dual bandwidth PLL circuitry that allows an associated central processing unit (CPU) to begin execution of instructions prior to acquiring phase/frequency-lock. As will be appreciated, the present invention substantially enhances the power savings of the portable battery by allowing the processor to operate during the phase/frequency-locking phase of the PLL. By eliminating the time spent waiting for the PLL to relock before allowing processor operation, a reduction of overall system power is achieved by increasing the time spent in the power saving mode. This is especially useful in applications where the system is repeatedly brought from a low power mode to an active mode such as in cellular phones, which periodically query the cellular system.

Figure 1:
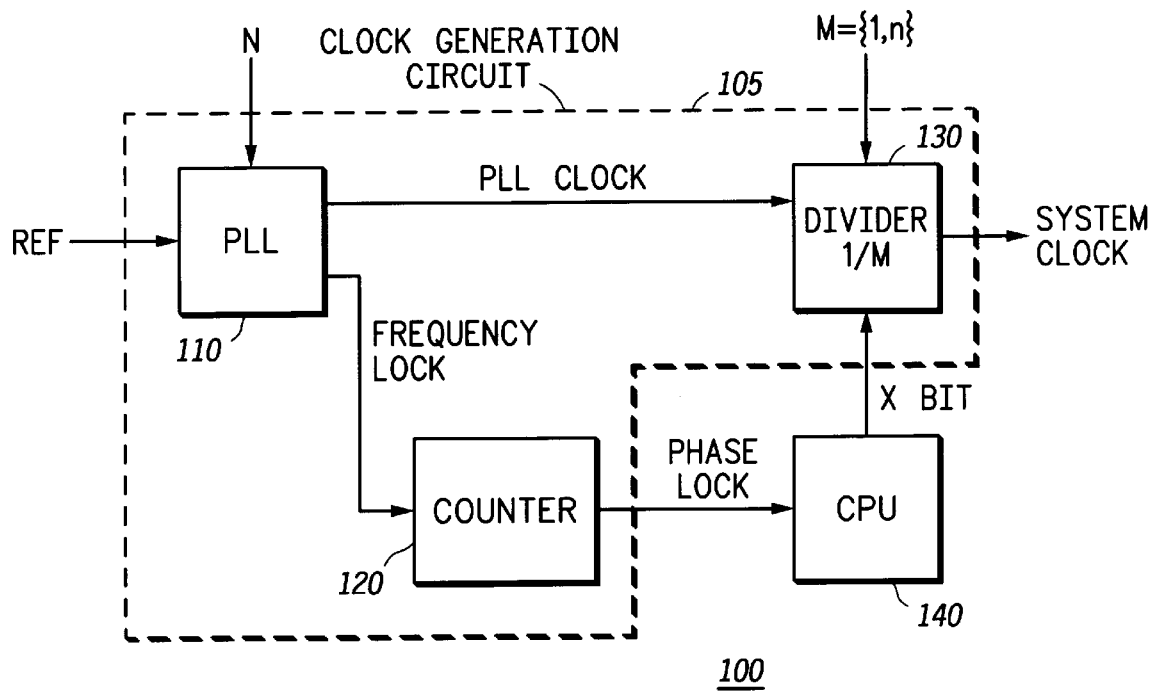
FIG. 1 shows a conventional microcontroller system having a PLL based clock generation circuit.

With reference now to the figures, and in particular with reference to FIG. 1, there is shown a conventional microcontroller system having a PLL based clock generation circuit. A microcontroller based system 100 includes a dual bandwidth PLL clock generation circuit 105. A dual bandwidth PLL is used in systems requiring a fast startup time but having a low frequency input reference to the PLL, for example. A dual bandwidth PLL has two phases of operation: 1) a wide bandwidth (high gain) phase and 2) a narrow bandwidth (low gain) phase. As used in power conscious designs, a low frequency reference clock (REF) is input into PLL 110 within circuit 105, which synthesizes the reference clock to produce the PLL circuit output (PLL CLOCK) as a function of a multiplication factor input (N). In some systems, PLL 110 is a dual bandwidth PLL to decrease lock time. PLL 110 outputs the PLL CLOCK to a divider 130 and outputs a FREQUENCY Lock signal to a counter 120. The FREQUENCY LOCK signal indicates when the PLL clock has reached the programmed frequency of the PLL to within a selected bandwidth, while the PLL is operating in a wide bandwidth mode. However, because the PLL must still reach a phase locked condition before the PLL can switch from the wide bandwidth to narrow bandwidth operation, an empirically derived settling time, for example 10 milliseconds, is counted off by counter 120 to ensure that the PLL has phase-locked. After the 10 milliseconds has been counted, counter 120 outputs a PHASE LOCK signal to CPU 140 to allow CPU 140 to begin execution while being clocked by the system clock (SYSTEM CLOCK).

Divider 130 is controlled by a register bit (X BIT) output by CPU 140. Divider 130 is programmed to divide the PLL CLOCK to one of two desired operating frequencies as set by an input M and selected by X BIT. In the prior art, divider 130 will typically produce a system clock equal to or half the frequency of PLL CLOCK. The programmable feature of Divider 130 is particularly useful in applications where the CPU 140 transitions the system clock from one operating frequency to another. The divider 130 prevents frequency overshoot of the system clock occurring at the transition between frequencies, which can cause CPU execution errors or memory access failures, among other problems.

Figure 2:
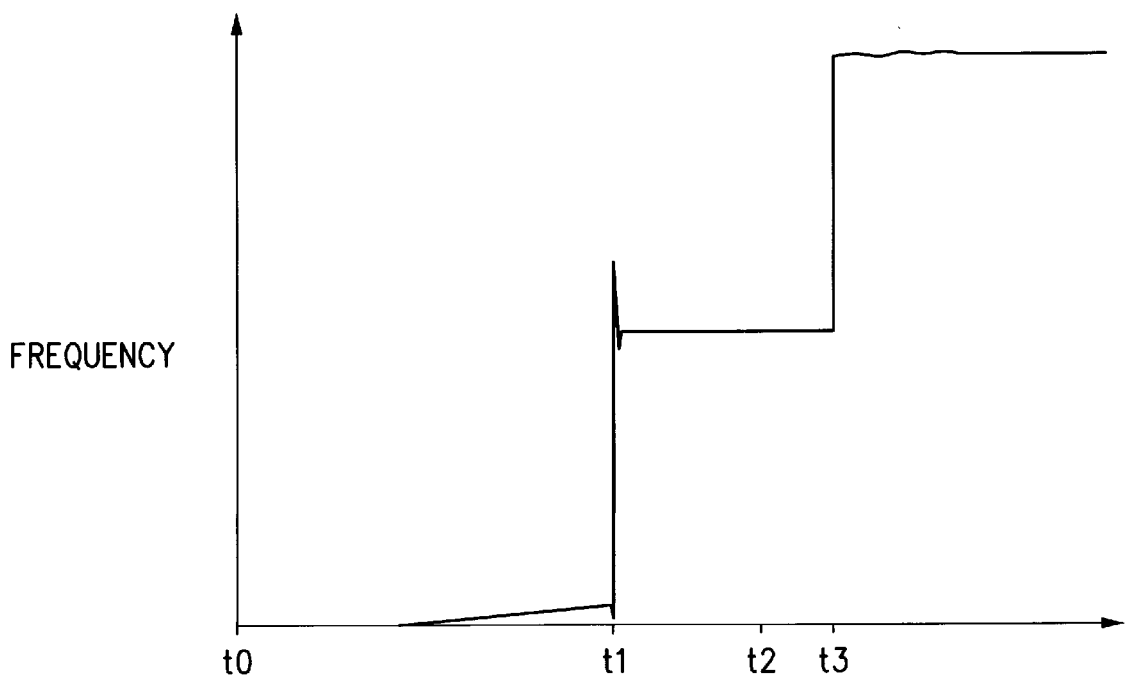
FIG. 2 graphs system clock frequency (SYSTEM CLOCK) over time during a start up period for the system in FIG. 1.

Such frequency overshoots can be seen in FIG. 2, which graphs system clock frequency (SYSTEM CLOCK) versus time during a start up period for the system in FIG. 1. At time $t_0$, the system 100 is switching from a low power mode to an active mode and the reference clock is input into PLL 110. At time $t_1$, PLL 110 recognizes the reference clock and begins to acquire the target frequency. Because PLL 110 is initially operating in the wide bandwidth mode, a large overshoot in frequency occurs as PLL 100 rapidly attempts to acquire frequency lock to the reference clock, as can be seen in the graph of FIG. 2. Divider 130 divides the PLL clock by half to generate the system clock during this start-up mode but the CPU does not begin execution at this point. When PLL 110 determines that it has reached the programmed frequency, the FREQUENCY LOCK signal is output to counter 120, which initiates the 10 millisecond count based on the reference clock. The end of the count indicates when the PLL has sufficiently settled to transition to the narrow bandwidth operating mode. At time $t_2$, counter 120 outputs the PHASE LOCK signal to CPU 140 to enable CPU 140 to begin execution. Also, PHASE LOCK is received by PLL 110 (connection not shown) to switch PLL 110 to narrow bandwidth operation. At time $t_3$, CPU 140 provides a X BIT to select the unity divisor of divider 130, which switches the SYSTEM CLOCK to the frequency of PLL CLOCK. As can be seen, during the 10 milliseconds period between $t_1$ and $t_2$, CPU 140 is not allowed to execute code and therefore is not operational. However, clock generation circuit 100 and other circuits within the system have been switched from the low power mode into an active mode and are inefficiently consuming power.

Figure 3:
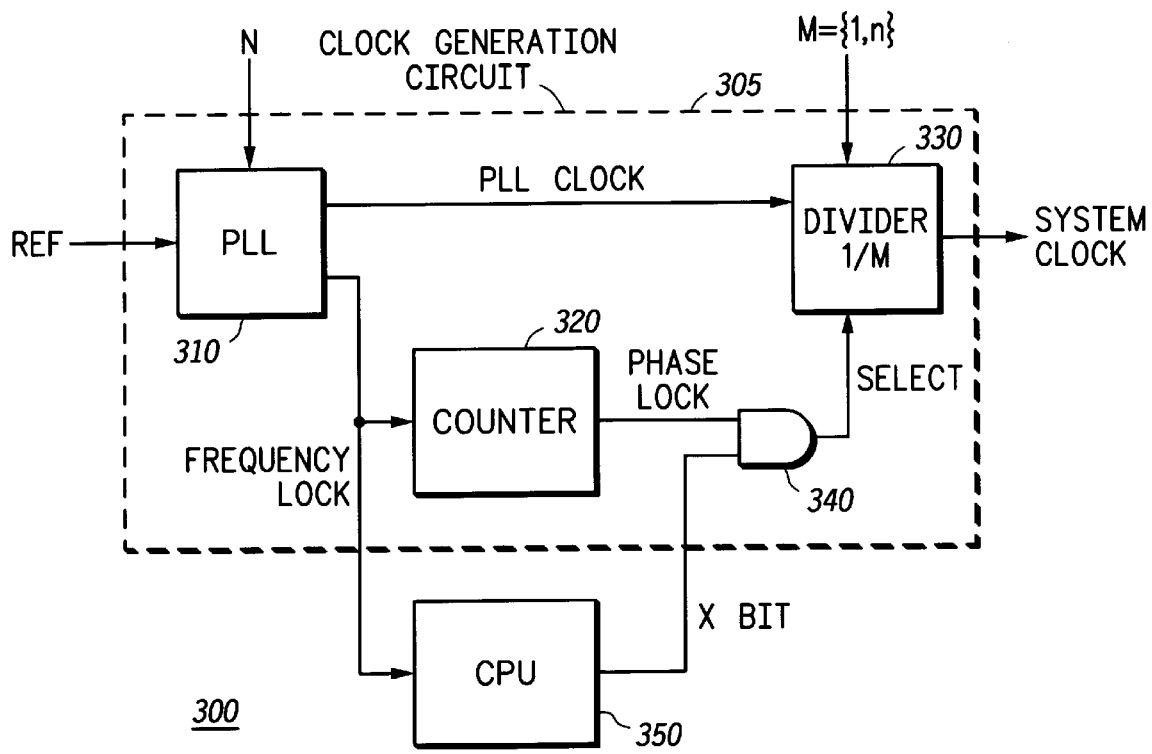
FIG. 3 shows a microcontroller system having a PLL based clock generation circuit, in accordance with a preferred embodiment of the present invention.

The present invention provides a method and system for reducing this inefficiency in systems having a low frequency reference clock by allowing the CPU to operate during the phase locking period at an useful operating frequency without allowing the system clock to exceed the system's maximum specified operating frequency. With reference now to FIG. 3, there is shown a microcontroller system having a PLL based clock generation circuit, in accordance with a preferred embodiment of the present invention. System 300 includes CPU 350 and CLOCK GENERATION CIRCUIT 305. A low frequency reference clock (REF) is input into dual bandwidth PLL 310 within circuit 305.

PLL 310 operates in a wide bandwidth mode (highgain) when acquiring phaselock and a narrow bandwidth mode (lowgain) to maintain phaselock. PLL 310 synthesizes the reference clock to produce the PLL CLOCK as a function of a multiplication factor (N). In one embodiment, where the reference clock is a low frequency clock at 33 kilohertz, N is equal to 512. PLL 310 outputs the PLL CLOCK to a divider 330. Divider 330 is controlled by a SELECT signal output by AND gate 340 and is programmed to divide the PLL CLOCK to one of two desired operating frequencies as set by an input M as a SYSTEM CLOCK output.

PLL 310 also outputs a FREQUENCY LOCK signal to a counter 320 and CPU 350. The FREQUENCY LOCK signal indicates when the PLL CLOCK has reached the programmed output frequency of the CLOCK GENERATION CIRCUIT to within a selected bandwidth. However, because the PLL must still reach a phase locked condition to allow the PLL to switch from the wide bandwidth to narrow bandwidth operation and reach a stable frequency, a settling period indicated by a PHASE LOCK signal is counted off by counter 320 to ensure that the PLL has phase-locked. The FREQUENCY LOCK signal initiates the target frequency enable counter 320 to count off the preset period from $t_1$ to $t_2$. Counter 320 generates the PHASE LOCK signal input into AND gate 340 at the end of the count. The FREQUENCY LOCK signal also enables CPU 350 to begin operation and perform programmed tasks during the phase locking period. Because the processor is being clocked by SYSTEM CLOCK at a divided frequency, there is no danger of exceeding the maximum specified frequency during the phase/frequency lock period.

CPU 350 can be programmed to assert the X BIT from a read/write register to request maximum speed operation at any desired time. The X BIT and the PHASE LOCK signal are input into AND gate 340. The SELECT output of AND gate 340 controls divider 330, where the SELECT signal selects the target frequency M to equal 1 or n. Thus, as will be appreciated, the SELECT signal selects the divider function of divider 330 as a selected divisor n until both the CPU 350 has requested full speed operation by asserting the X BIT and the settling period counted by counter 320 has expired. When the SELECT signal is generated, divider 330 switches to produce a SYSTEM CLOCK at the full frequency of the PLL CLOCK (or some fraction thereof as desired).

Figure 4:
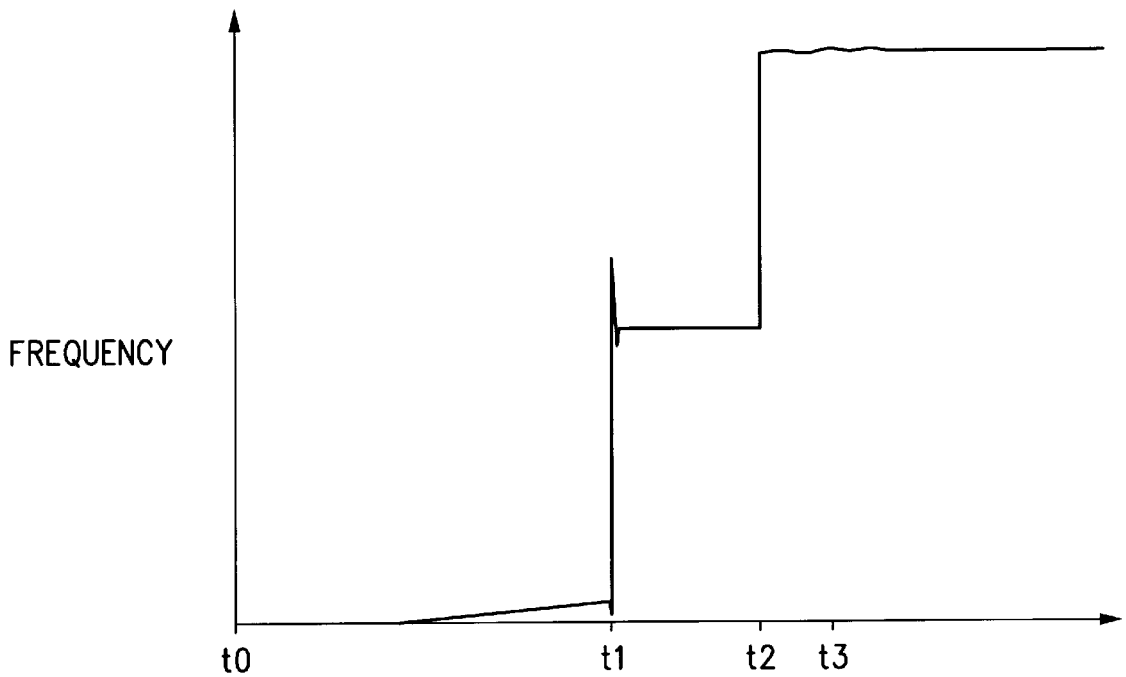
FIG. 4 illustrates a graph of the system clock frequency (SYSTEM CLOCK) over time in one example of a start up period of the system of FIG. 3, in accordance with a preferred embodiment of the present invention.

FIG. 4 shows a graph of the system clock frequency (SYSTEM CLOCK) over time in one example of a start up period of the system of FIG. 3. At time $t_0$, the portable device 300 is switching from the low power mode to an active mode and the reference clock is input into PLL 310. At time $t_1$, PLL 310 recognizes the reference clock and begins to acquire the target frequency. Because PLL 310 is initially operating in the wide bandwidth mode, a large overshoot in frequency occurs as PLL 310 rapidly attempts to acquire frequency lock to the reference clock. Divider 330 divides the PLL clock by the divisor M to generate the system clock during this start-up mode. When PLL 310 determines that it has reached the average frequency of the expected output, which occurs very soon after time $t_1$, a FREQUENCY LOCK signal is output to counter 320, which begins to count a period (for example, a 10 millisecond period requiring 328 counts of counter 320) based on the reference clock. The FREQUENCY LOCK simultaneously enables CPU 350 to begin operation at around time $t_1$, rather than $t_2$ as was seen in the prior art. This might allow a portable system such as a cellular phone to potentially complete the work required during that cellular cycle prior to the system reaching the maximum frequency operation at time $t_2$. Because CPU 350 operates at half the maximum operating frequency while PLL 310 is phase locking, there is no danger of exceeding maximum frequency.

At time $t_2$, counter 320 outputs the PHASE LOCK signal to AND gate 340, indicating the PLL has sufficiently settled to transition into narrow bandwidth phase. Also, PHASE LOCK is received by PLL 310 (connection not shown) to switch PLL 310 to narrow bandwidth operation. At or prior to time $t_2$ (or after $t_2$ in another example), CPU 350 asserts the X BIT to select the unity divisor of divider 330, which switches the SYSTEM CLOCK to the frequency of PLL CLOCK. In a preferred embodiment, the frequency of PLL CLOCK would be the system's specified maximum frequency. As seen in FIG. 4, the system of the present invention is able to achieve maximum operating frequency at time $t_2$ because CPU 350 has been executing at half frequency during the period $t_1-t_2$ so that it is operational at the time phase lock occurs and can issue the X BIT immediately. Thus, as FIG. 4 illustrates, the system of the preferred embodiment operates at half operating frequency during period $t_1-t_2$ and full operating frequency between time $t_2$ and $t_3$ to allow the system to complete its operating tasks and return to low power mode sooner. The prior art system does not even begin to execute code until after $t_3$.

Therefore, it will now be appreciated that the present invention provides a PLL based clock generation circuit that enables processor execution during phase locking of the system clock. This will substantially improve power conservation and increase processing capabilities. A PLL generates a PLL clock output to a divider, which divides the PLL clock to a system clock output. The PLL outputs a frequency lock signal upon acquiring a desired output frequency, which initiates a counter and enables execution in a CPU being clocked by the system clock. The CPU is thereby enabled to execute at a divided frequency during phase locking without risk of frequency overshoot induced failures. When the counter expires and the CPU requests maximum frequency operation, a select signal is produced that switches the divider to output a maximum frequency system clock, thereby enabling the CPU to execute at maximum frequency when the PLL is safely phase locked.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true scope of the invention.

What is claimed is:

1. A system comprising:

a Phase Locked Loop (PLL) generating a first signal and a PLL clock based on a reference clock;

a divider circuit receiving the PLL clock and a select signal and generating a system clock, wherein the divider circuit generates the system clock at a first frequency if the select signal is in a first state and generates the system clock at a second frequency if the select signal is in a second state;

a enable circuit receiving the first signal and generating a second signal;

a processor receiving the first signal and selectively generating a third signal, the processor being enabled in response to the first signal; and a select circuit receiving the second signal and the third signal and generating the select signal in response to the second signal and the third signal.

2. The system of claim 1, wherein the select circuit is an AND gate.

3. The system of claim 1, wherein the first frequency is twice the second frequency.

4. The system of claim 1, wherein the enable circuit comprises a counter that counts a clock.

5. The system of claim 4, wherein:

the second signal is asserted when the counter increments to a delay count; and the delay count is a number between three hundred and four hundred.

6. The system of claim 5, wherein:

the delay count is 328.

7. The system of claim 4, wherein:

the second signal is asserted when the counter decrements from a delay count down to zero.

8. The system of claim 1, wherein:

the PLL has a narrow bandwidth mode and a wide bandwidth mode.

9. The system of claim 1, wherein:

the third signal is generated by the processor from a writable register.

10. The system of claim 1, wherein:

the second signal is reported to the processor as a bit in a readable register.

11. The system in claim 1 wherein:

the first signal is generated based on the PLL achieving an expected frequency within a predefined bandwidth.

12. A system comprising:

a Phase Locked Loop (PLL) generating a first signal and a PLL clock based on a reference clock, wherein:

the PLL comprises a charge pump having a narrow bandwidth mode and a wide bandwidth mode, the first signal is generated based on the PLL achieving an expected frequency within a predefined bandwidth, and the expected frequency is a specified multiple of the reference clock;

a divider circuit receiving the PLL clock and a select signal and generating a system clock, wherein:

the divider circuit generates the system clock at a first frequency if the select signal is in a first state and generates the system clock at a second frequency if the select signal is in a second state;

a enable circuit receiving the first signal and generating a second signal wherein the enable circuit comprises a counter;

a processor receiving the first signal and selectively generating a third signal; and a select circuit receiving the second signal and the third signal and generating the select signal in response to the second signal and the third signal.

13. A method of operation for a data processing system, the method comprising:

A) generating a system clock from a PLL clock by providing one of a plurality of frequencies based on receipt of a select signal;

B) generating the select signal based on receipt of a second signal and a third signal;

C) generating the second signal after receiving a first signal;

D) generating the third signal in a processor that is enabled by the first signal; and E) generating the first signal in response to frequency locking the PLL clock.

14. The method in claim 13 wherein step (C) comprises:

starting a counter in response to receipt of the first signal;

incrementing the counter in response to a clock; and generating the second signal when the counter is incremented to a delay count.

15. The method in claim 13 further comprising:

generating the PLL clock in response to a first current level when in a wide bandwidth mode, and generating the PLL clock in response to a second current level when in a narrow bandwidth mode.

16. The method in claim 13 wherein:

the third signal is generated by said processor based on the value of a bit in a register.

17. The method in claim 13 further wherein:

a first one of the plurality of frequencies is double a second one of the plurality of frequencies.

18. The method in claim 13 wherein within step (E):

the first signal is generated based on the PLL achieving an expected frequency within a predefined bandwidth, and the expected frequency is a specified multiple of a reference clock.

19. The method in claim 13 wherein the processor is enabled to execute instructions in response to the first signal.

* * * * *